(12) United States Patent
Rana

(10) Patent No.: US 10,284,201 B1
(45) Date of Patent: May 7, 2019

(54) HIGH RANGE POSITIVE VOLTAGE LEVEL SHIFTER USING LOW VOLTAGE DEVICES

(71) Applicant: STMICROELECTRONICS INTERNATIONAL N.V., Schiphol (NL)

(72) Inventor: Vikas Rana, Noida (IN)

(73) Assignee: STMicroelectronics International N.V., Schiphol (NL)

(*) Notice: Subject to any disclaimer, the term of this patent is extended or adjusted under 35 U.S.C. 154(b) by 0 days.

(21) Appl. No.: 15/877,970

(22) Filed: Jan. 23, 2018

(51) Int. Cl.
*H03L 5/00* (2006.01)
*H03K 19/00* (2006.01)
*H03K 19/017* (2006.01)
*H03K 19/0185* (2006.01)

(52) U.S. Cl.
CPC ... *H03K 19/0013* (2013.01); *H03K 19/01707* (2013.01); *H03K 19/018521* (2013.01)

(58) Field of Classification Search
CPC ......... H03K 19/0013; H03K 19/01707; H03K 19/018521
USPC .................. 327/306, 333; 326/61–62, 80–81
See application file for complete search history.

(56) References Cited

U.S. PATENT DOCUMENTS

| 7,863,963 | B2 * | 1/2011 | Zhang | H03K 3/356113 327/333 |
| 7,919,983 | B1 | 4/2011 | Rana | |
| 8,461,899 | B2 * | 6/2013 | Rana | H03K 3/356165 326/61 |
| 8,710,897 | B2 * | 4/2014 | Kim | H03K 3/356113 327/333 |
| 9,755,621 | B1 | 9/2017 | Sinha et al. | |

* cited by examiner

*Primary Examiner* — Dinh T Le
(74) *Attorney, Agent, or Firm* — Seed IP Law Group LLP

(57) ABSTRACT

A voltage level shifter is provided. The voltage level shifter includes an input stage and at least one level shifting stage. The input stage receives an input voltage and a complementary input voltage and receives a first supply voltage and a ground voltage. The input stage outputs one of the first supply voltage and the ground voltage over a first output voltage node and a first complementary output voltage node based on the input voltage and the complementary input voltage. A level shifting stage is coupled to the input stage. The level shifting stage receives the first supply voltage and a second supply voltage and outputs one of the ground voltage, the first supply voltage and the second supply voltage over second and third output voltage nodes and second and third complementary output voltage nodes based on voltages of the first output voltage node and the first complementary output voltage node.

21 Claims, 2 Drawing Sheets

| $V_{IN}$ | $V_{OUT0}$ | $V_{OUT1}$ | $V_{OUT2}$ | $V_{OUT3}$ | $V_{OUT4}$ |
|---|---|---|---|---|---|
| 0 | 0 | 0 | $V_{UNI}$ | $V_{UNI}$ | $2V_{UNI}$ |
| $V_{ON}$ | $V_{UNI}$ | $2V_{UNI}$ | $2V_{UNI}$ | $3V_{UNI}$ | $3V_{UNI}$ |

| $\overline{V_{IN}}$ | $\overline{V_{OUT0}}$ | $\overline{V_{OUT1}}$ | $\overline{V_{OUT2}}$ | $\overline{V_{OUT3}}$ | $\overline{V_{OUT4}}$ |
|---|---|---|---|---|---|
| $V_{ON}$ | $V_{UNI}$ | $2V_{UNI}$ | $2V_{UNI}$ | $3V_{UNI}$ | $3V_{UNI}$ |
| 0 | 0 | 0 | $V_{UNI}$ | $V_{UNI}$ | $2V_{UNI}$ |

*FIG. 2*

HIGH RANGE POSITIVE VOLTAGE LEVEL SHIFTER USING LOW VOLTAGE DEVICES

BACKGROUND

Technical Field

This disclosure is directed to a voltage level shifter and, in particular, a voltage level shifter that uses low voltage devices to provide high positive output voltage levels.

Description of the Related Art

Level shifters are widely used in electronic devices, where different voltage supply levels are used. Level shifters may be used to provide a variety of voltage levels to devices in the same power domain or in different and isolated power domains. Due to the breadth of their output voltage level range, conventional voltage level shifters use high voltage devices, such as transistors. The high voltage devices are larger and more expensive to manufacture than their low voltage counterparts, such as, for example, low voltage transistors in the 1.2 to 4 Volts (V) range. In many cascode-based high voltage level shifter architectures, all nets are not very well driven, hence causing slow response timing. In addition, they can also cause high current consumption.

It is, therefore, desirable to have a voltage level shifter that is capable of providing a wide range of output voltages while using low voltage devices. It is also desirable for the voltage level shifter to have well-fed nodes.

BRIEF SUMMARY

Provided is a voltage level shifter that provides a range of output voltages while using low voltage devices. The voltage level shifter is structured to receive a variety of input voltages, such as in the range of 0 to 1.8V, and provide output voltages of 0, 5, 10 and 15 V while using low voltage devices, capable of 5V, for example. Usage of low voltage devices is advantageous in that it reduces the cost of the level shifter because higher voltage devices, such as those in the range of 10V to 15V or further high voltage devices like Double-diffused Metal Oxide Semiconductor (DMOS), are more expensive to manufacture.

During operation, the voltage level shifter has nodes that are fed with supply voltages and the voltage level shifter does not have floating nodes or high impedance nodes that are not fed with supply voltages. Having well-fed nodes improves the power efficiency and reduces the power consumption of the level shifter and improves the timing of the level shifter circuit and enables fast response.

BRIEF DESCRIPTION OF THE SEVERAL VIEWS OF THE DRAWINGS

FIG. 2 shows the output voltages of the level shifter as a function of input and complementary input voltages.

DETAILED DESCRIPTION

Figure 1:
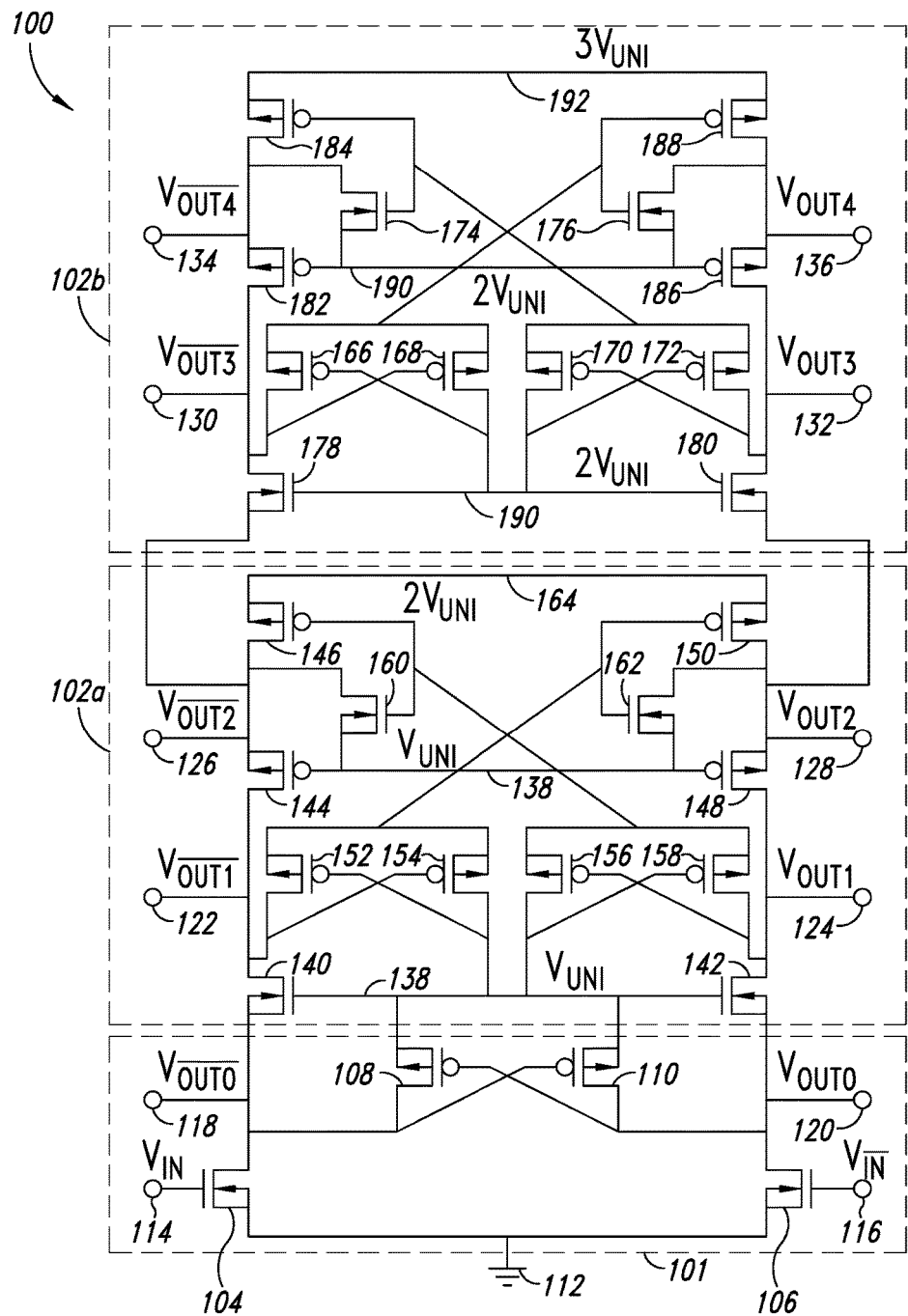
FIG. 1 shows a circuit diagram of a voltage level shifter in accordance with an embodiment.

FIG. 1 shows a circuit diagram of a voltage level shifter 100 in accordance with an embodiment. The level shifter 100 includes an input stage 101 and two voltage level shifting stages 102a, 102b (collectively referred to herein as voltage level shifting stages 102). It is noted that although two level shifting stages 102a, 102b are shown in FIG. 1, the level shifter 100 may include any other number of level shifting stages 102. The level shifter 100 is coupled between an input voltage node 114, a complementary input voltage node 116, a plurality of output voltage nodes and a plurality of complementary output voltage nodes.

The level shifter 100 receives an input voltage over the input voltage node 114 and a complementary input voltage (that is a complement of the input voltage) over the complementary input voltage node 116. The level shifter 100 outputs a plurality of output voltages over the plurality of output voltage nodes, respectively, and a plurality of complementary output voltages over the plurality of complementary output voltage nodes, respectively. The plurality of output voltage nodes are shown to include a first output voltage node 120. In addition, each level shifting stage 102 is shown to include two output voltage nodes. In particular, in FIG. 1, the first level shifting stage 102a includes a second output voltage node 124 and a third output voltage node 128, and the second level shifting stage 102b includes a fourth output voltage node 132 and a fifth output voltage node 136.

The plurality of complementary output voltage nodes are shown to include a first complementary output voltage node 118. In addition, each level shifting stage 102 is shown to include two complementary output voltage nodes. In particular, in FIG. 1, the first level shifting stage 102a includes a second complementary output voltage node 122 and a third complementary output voltage node 126, and the second level shifting stage 102b includes a fourth complementary output voltage node 130 and a fifth complementary output voltage node 134.

The input stage 101 includes plurality of transistors. The plurality of transistors include an input transistor 104, a complementary input transistor 106 and a first and a second transistors 108, 110 that are cross coupled. The input transistor 104 has a source coupled to a ground node 112, a gate coupled to the input voltage node 114 and a drain coupled to a first complementary output voltage node 118. The complementary input transistor 106 has a source coupled to the ground node 112, a gate coupled to a complementary input voltage node 116 and a drain coupled to the first output voltage node 120.

The first transistor 108 has a gate coupled to the first output voltage node 120, a source coupled to a first voltage supply node 138 and a drain coupled to the first complementary output voltage node 118. The second transistor 110 has a gate coupled to the first complementary output voltage node 118, a source coupled to the first voltage supply node 138 and a drain coupled to the first output voltage node 120.

The level shifting stages 102a, 102b are similarly structured. The first level shifting stage 102a includes a complementary input transistor 140 and an input transistor 142. The first level shifting stage 102a includes a first complementary output transistor 144, a second complementary output transistor 146, a first output transistor 148 and a second output transistor 150.

The first level shifting stage 102a also includes two pairs of cross coupled transistors. In particular, a first pair of cross coupled transistors includes a first transistor 152 and a second transistor 154 and a second pair of cross coupled transistors includes a third transistor 156 and a fourth transistor 158. The first level shifting stage 102a also includes a fifth transistor 160 and a sixth transistor 162.

In the first level shifting stage 102a, the complementary input transistor 140 has a gate coupled to the first voltage supply node 138, a source coupled to the first complementary output voltage node 118 and a drain coupled to the second complementary output voltage node 122. Similarly, the input transistor 142 has a gate coupled to the first voltage supply node 138, a source coupled to the first output voltage node 120 and a drain coupled to the second output voltage node 124.

The first pair of cross coupled transistors is configured as follows: the first transistor 152 has a gate coupled to the first voltage supply node 138, a source coupled to the gate of the second output transistor 150 and a drain coupled to the second complementary output voltage node 122. Further, the second transistor 154 has a gate coupled to the second complementary output voltage node 122, a source coupled to the gate of the second output transistor 150 and a drain coupled to the first voltage supply node 138.

In the second pair of cross coupled transistors, the first transistor 156 has a gate coupled to the second output voltage node 124, a source coupled to the gate of the second complementary output transistor 146 and a drain coupled to the first voltage supply node 138. The second transistor 158 of the second pair has a gate coupled to the first voltage supply node 138, a source coupled to the gate of the second complementary output transistor 146 and a drain coupled to the second output voltage node 124.

The first complementary output transistor 144 has a gate coupled to the first voltage supply node 138, a source coupled to the third complementary output voltage node 126 and a drain coupled to the second complementary output voltage node 122. The second complementary output transistor 146 has a gate coupled to the sources of the third and fourth transistors 156, 158, a source coupled to the second voltage supply node 164 and a drain coupled to the third complementary output voltage node 126.

The first output transistor 148 has a gate coupled to the first voltage supply node 138, a source coupled to the third output voltage node 128 and a drain coupled to the second output voltage node 124. The second output transistor 150 has a gate coupled to the sources of the first and second transistors 152, 154, a source coupled to the second voltage supply node 164 and a drain coupled to the third output voltage node 128.

The fifth transistor 160 has a gate coupled to all of: the gate of the second complementary output transistor 146 and the sources of the third and fourth cross coupled transistors 156, 158. The fifth transistor 160 has a source coupled to the first voltage supply node 138 and a drain coupled to the third complementary output voltage node 126. The sixth transistor 162 has a gate coupled to all of: the gate of the second output transistor 150 and the sources of the first and second transistors 152, 154. The sixth transistor 162 has a source coupled to the first voltage supply node 138 and a drain coupled to the third output voltage node 128.

The second level shifting stage 102b has an identical structure as the first level shifting stage 102a. Before describing the second level shifting stage 102b, the operation of the first level shifting stage 102a is described to facilitate presentation.

The input voltage node 114 and the complementary input voltage node 116 are supplied with logically complementary voltages. For example, if the input voltage node 114 is supplied with a voltage level that is 1.2V or 1.8V, then the complementary input voltage node 116 is supplied with a voltage level of 0 V. Similarly, as one possibility a higher positive voltage of 4 V, for example, may alternatively be supplied with a complementary voltage of 0 V.

As described herein, turning on a transistor requires applying a gate-to-source voltage ($V_{GS}$) to the transistor that exceeds the transistor's threshold voltage ($V_{th}$). Turning on the transistor causes the transistor to be in the electrically conductive state, whereby current flows between the transistor's source and drain. Conversely, a transistor is turned off when the gate-to-source voltage ($V_{GS}$) is less than the threshold voltage ($V_{th}$). Transistors typically have threshold voltages ($V_{th}$) in the range between 500 and 800 millivolts (mV).

For the level shifter 100 to operate as a level shifter, one of the input or complementary input voltages is set to a voltage level that is greater than the threshold voltage of the transistors used in the level shifter 100. This voltage level is referred to as an on voltage, among others and depends on the threshold voltages ($V_{th}$) of the transistors of the level shifter 100. The complementary input voltage is set to a voltage level of 0 V.

Furthermore, the first voltage supply node 138 provides a unitary voltage ($V_{UNI}$) that is linked to the maximum operating voltage range of transistors used in circuit. If transistor used is of 3V-capable then $V_{UNI}$ can be 3V, if transistor is 4V-capable then $V_{UNI}$ is 4V or else if transistor is capable of 5V then $V_{UNI}$ is 5V. The second voltage supply node 164 provides two multiples of the unitary voltage ($2V_{UNI}$). For example, if the unitary voltage is 5V then the first voltage supply node 138 provides a voltage of 5V and the second voltage supply node 164 provides a voltage of 10V. In addition, if the unitary voltage is 4V then the first voltage supply node 138 provides a voltage of 4V and the second voltage supply node 164 provides a voltage of 8V.

When an on voltage is applied to the input voltage node 114, the input transistor 104 is conductive because the difference between the on voltage at its gate and the ground voltage supplied by the ground node 112 at its source exceeds the threshold voltage. When the input transistor 104 is in the conductive state, the first complementary output voltage node 118 is grounded outputs ground voltage of 0 V. The ground voltage is applied to the gate of the second transistor 110 of the input stage 101. Meanwhile, the source of the second transistor 110 is coupled to the first voltage supply node 138 and receives the on voltage. The second transistor 110 is a P-channel metal-oxide-semiconductor field-effect transistor (MOSFET). Because the gate-to-source voltage ($V_{GS}$) of the P-channel second transistor 110 is less than the threshold voltage ($V_{th}$), the second transistor 110 is turned on and the voltage of the first output voltage node 120 is pulled up to the unitary voltage. Similarly, the first transistor 108 is off.

When the first complementary output voltage node 118 outputs a ground voltage and the first output voltage node 120 outputs a unitary voltage, the complementary input transistor 140 is on and the input transistor 142 is off. The complementary input transistor 140 is on because it is an N-channel transistor where the gate receives a unitary voltage whereas the source receives a ground voltage. Conversely, the input transistor 142 is off because it is an N-channel transistor where both the gate and the source receive the same unitary voltage. As a result, the second complementary output voltage node 122 has a ground voltage.

The second complementary output voltage node 122 is coupled to the gate of the second transistor 154. When the gate is grounded, the second transistor 154 is turned on and the source of the second transistor 154 is pulled down to the unitary voltage. The source of the second transistor 154 is coupled to the gates of both the second output transistor 150 and the sixth transistor 162. As a result, the sixth transistor 162 is off. Further, the second output transistor 150 is on because the gate-to-source voltage (of one negative unit of the unitary voltage) is less than the threshold voltage of the second output transistor 150. When the second output transistor 150 is on, the voltage of the second voltage supply node 164 is passed to the third output voltage node 128. In addition, the first output transistor 148 will be on resulting in the voltage of the second voltage supply node 164 being also passed on to the second output voltage node 124.

In the second pair of cross-coupled transistors, the third transistor 156 is off and the fourth transistor 158 is on. Therefore, the voltage of the second output voltage node 124 is passed to the gates of the second complementary output transistor 146 and the fifth transistor 160. As a result, the fifth transistor 160 is on and the voltage of the first voltage supply node 138 is passed to the third complementary output voltage node 126. At the same time, the second complementary output transistor 146 is off. Thus, the output at the second complementary output voltage node 122 is retained at the ground voltage.

During the operation of the first level shifting stage 102a (as well as the second level shifting stage 102b described herein) all the node are well-fed with supply voltages. As a result, the level shifter 100 becomes energy-efficient. In addition, in the level shifter 100, all devices (or transistors) operate with a maximum voltage difference (for example, gate-to-source voltage) of one unit of the unitary voltage, such as 4 or 5 V. Accordingly, the level shifter 100 may be implemented using low-power devices, which reduces the cost of making the level shifter and increases the shelf life of the level shifter 100.

In the input stage 101, the input transistor 104 and a complementary input transistor 106 are shown as N-channel MOSFETs and the first and second transistors 108, 110 are shown as P-channel MOSFETs. However, in alternative embodiments other types of transistors or switches may be used. Similarly, although the transistors 140, 142, 160, 162 are shown as N-channel MOSFETs and the transistors 152, 154, 156, 158, 144, 146, 148, 150 are shown as P-channel MOSFETs in the first level shifting stage 102a, in alternative embodiments other types of transistors or switches may be used.

The second level shifting stage 102b is configured similarly as the first level shifting stage 102a. The second level shifting stage 102b includes a first, second, third, fourth, fifth and sixth transistors 166, 168, 170, 172, 174, 176 of which the first and second transistors 166, 168 are cross-coupled and the third and fourth 170, 172 are also cross-coupled. The second level shifting stage 102b also includes a complementary input transistor 178, an input transistor 180, a first complementary output transistor 182, a second complementary output transistor 184, a first output transistor 186 and a second output transistor 188.

The gates of the complementary input transistor 178, the input transistor 180, the first complementary output transistor 182 and the first output transistor 184 are coupled to a first voltage supply node 190 that supplies the twice the unitary voltage. The gates of the second complementary output transistor 184 and the second output transistor 188 are coupled to a second voltage supply node 192. The second voltage supply node 190 of the second stage 102b supplies three times the unitary voltage.

As shown in FIG. 1, the transistors 166, 168, 170, 172, 174, 176, 178, 180, 182, 184, 186, 188 of the second level shifting stage 102b are similarly coupled to each other as the transistors 152, 154, 156, 158, 160, 162, 140, 142, 144, 146, 148, 150 of the second level shifting stage 102b are coupled to each other. It is noted that in each stage 102a, 102b, the gates of the complementary input transistors 140, 178, input transistors 142, 180, first complementary output transistors 144, 182 and first output transistors 148, 186 receive the same voltage. In the first and second stages 102a, 102b, these gates are respectively coupled to the first voltage supply nodes 138, 190. The voltage of the nodes 138, 164, 190, 192 depends on or is a function of a position of the level shifting stage 102 in the stack. A stack of two level shifting stages 102 is shown in FIG. 1, whereby the first level shifting stage 102a is in the first position (directly coupled to the input stage 101 and the input and complementary input transistors 104, 106) and the second level shifting stage 102b is in the second position (directly coupled to the first level shifting stage 102a). For the first level shifting stage 102a, the voltage of the first voltage supply node 138 is the same as the unitary voltage and the voltage of the second voltage supply node 164 is twice the unitary voltage.

For the second level shifting stage 102b, which is subsequent in the stack to the first level shifting stage 102a, the voltage of the first voltage supply node 190 is twice the unitary voltage and the voltage of the second voltage supply node 192 is three times the unitary voltage. For subsequent level shifting stages (not shown), the voltage of further first and second voltage supply nodes is increased in increments of one unitary voltage per each additional level shifting stage 102.

The sources of the complementary input transistor 178 and input transistor 180 of the second level shifting stage 102b are respectively coupled to the third complementary output voltage node 126 and the third output voltage node 128.

Continuing with describing the operation of the level shifter 100 above, a unitary voltage is provided at the third complementary output voltage node 126 and twice the unitary voltage is provided at the third output voltage node 128. Thus, the complementary input transistor 178 is on because the difference between the gate-to-source voltage ($V_{GS}$) is greater than the threshold voltage ($V_{th}$). The input transistor 180 is off because the gate and source voltages are the same and their difference of 0V is lower than the threshold voltage ($V_{th}$).

When the complementary input transistor 178 is on, the voltage of the fourth complementary output voltage node 130 is pulled down to the voltage of the third complementary output voltage node 126. As a result, the second transistor 168 is turned on and the voltage of the first voltage supply node 190 is provided at the gates of the sixth transistor 176 and the second output transistor 188. The gate and source voltages of the sixth transistor 176 are the same, which will cause the sixth transistor 176 to be off. The gate-to-source voltage ($V_{GS}$) of the second output transistor 188 is the negative level of the unitary voltage. Accordingly, as a P-channel transistor, the second output transistor 188 turns on resulting in the voltage of the fifth output voltage node 136 being pulled up to the voltage of the second voltage supply node 192. Similarly, the first output transistor 186 is also turned on and the fourth output voltage node 132 is also pulled up to the voltage level of the second voltage supply node 192.

As a result of bringing the voltage of the drain of the fourth transistor 172 to the second voltage supply node 192, the fourth transistor 172 turns on. The voltage of the second voltage supply node 192 is supplied to the gates of the fifth transistor 174 and the second complementary output transistor 184. Supplying the voltage to the gates keeps the second complementary output transistor 184 off and turns on the fifth transistor 174. Consequently, the voltage of the fifth complementary output voltage node 134 is pulled down to the voltage of the first voltage supply node 190.

Due to the symmetry of the level shifter 100, in the reverse scenario when the input voltage is the on voltage and the complementary input voltage is 0 V, the output voltages and the complementary output voltages are reversed. Switching between the input voltage and the complementary input voltage causes the output voltages and the complementary output voltages to be switched. The reversal of the output voltages and the complementary output voltages as a result of reversing the input and complementary input voltages is described with reference to FIG. 2.

FIG. 2 shows the output voltages of level shifter 100 as a function of the input and complementary input voltages. As shown in FIG. 2, when the input voltage is 0 V and the complementary input voltage is the on voltage, the first output voltage is 0 V, the second output voltage is 0 V, the third output voltage is the unitary voltage ($V_{UNI}$), the fourth output voltage is the unitary voltage ($V_{UNI}$), and the fifth output voltage is twice the unitary voltage ($2V_{UNI}$). Further, when the input voltage is 0 V and the complementary input voltage is the on voltage, the first complementary output voltage is the unitary voltage ($V_{UNI}$), the second complementary output voltage is twice the unitary voltage ($2V_{UNI}$), the third complementary output voltage is twice the unitary voltage ($2V_{UNI}$), the fourth complementary output voltage is three times the unitary voltage ($3V_{UNI}$), and the fifth complementary output voltage is three times the unitary voltage ($3V_{UNI}$). It is noted that the input voltage is may be less than $V_{UNI}$. The input voltage may be higher than ON voltage of transistors and less than maximum operating voltage of transistors. As described herein, supplying an on voltage to the input transistor 104 or the complementary input transistor 106 implies supplying a voltage high enough to turn on the input or complementary input transistors 104, 106. For example, the on voltage may be 1V, 1.2V or 1.8V, among others. The on voltage may also be the unitary voltage ($V_{UNI}$).

Due to the symmetry of the level shifter 100, if the input and complementary input voltages are reversed, the output and complementary output voltages are also reversed. Accordingly, when the input voltage is the unitary voltage ($V_{UNI}$) and the complementary input voltage is the ground voltage, the first output voltage is the unitary voltage ($V_{UNI}$), the second output voltage is twice the unitary voltage ($2V_{UNI}$), the third output voltage is twice the unitary voltage ($2V_{UNI}$), the fourth output voltage is three times the unitary voltage ($3V_{UNI}$), and the fifth output voltage is three times the unitary voltage ($3V_{UNI}$). Further, the first complementary output voltage is 0 V, the second complementary output voltage is 0 V, the third complementary output voltage is the unitary voltage ($V_{UNI}$), the fourth complementary output voltage is the unitary voltage ($V_{UNI}$), and the fifth complementary output voltage is twice the unitary voltage ($2V_{UNI}$).

The level shifter 100 thus provides a wide array of output voltages based on the input voltages. Any one of the voltage output nodes or complementary voltage output nodes of the level shifter 100 may be coupled to a device that receives a supply voltage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage level shifter, comprising:
   an input stage having an input voltage node, a complementary input voltage node, a first output voltage node and a first complementary output voltage node; and
   a first level shifting stage including:
      a first output transistor having first and second conduction terminals coupled to the first output voltage node and a second output voltage node, respectively, and a gate coupled to a first supply voltage node;
      a first complementary output transistor having first and second conduction terminals coupled to a second complementary output voltage node and a second supply voltage node, respectively; and
      first and second transistors that are cross-coupled, the first transistor having a first conduction terminal coupled to a gate of the first complementary output transistor, a second conduction terminal coupled to the first supply voltage node, and a gate coupled to the second output voltage node, the second transistor having a first conduction terminal coupled to the gate of the first complementary output transistor, a second conduction terminal coupled to the second output voltage node, and a gate coupled to the first supply voltage node.

2. The voltage level shifter of claim 1, wherein the input stage includes:
   an input transistor having first and second conduction terminals coupled to the first complementary output voltage node and a ground node, respectively, and a gate coupled to the input voltage node;
   a complementary input transistor having a first and a second conduction terminals coupled to the first output voltage node and the ground node, respectively, and a gate coupled to the complementary input voltage node; and
   a first input stage cross-coupled transistor and a second input stage cross-coupled transistor.

3. The voltage level shifter of claim 2, wherein the first input stage cross-coupled transistor has first and second conduction terminals coupled to the first supply voltage node and the first complementary output voltage node, respectively, and a gate coupled to the first output voltage node, and the second input stage cross-coupled transistor has first and second conduction terminals coupled to the first supply voltage node and the first output voltage node, respectively, and a gate coupled to the first complementary output voltage node.

4. The voltage level shifter of claim 1, wherein the first level shifting stage includes:
   a second output transistor having a first conduction terminal coupled to the second output voltage node and a second conduction terminal coupled to a third output voltage node, respectively, and a gate coupled to the first supply voltage node; and
   a third output transistor having a first conduction terminal coupled to the third output voltage node and a second conduction terminals coupled to the second supply voltage node, and a gate.

5. The voltage level shifter of claim 1, wherein the first level shifting stage includes:
   a second complementary output transistor having a first conduction terminal coupled to the first complementary output voltage node, a second conduction terminal coupled to a third complementary output voltage node, and a gate coupled to the first supply voltage node; and a third complementary output transistor having first and second conduction terminals coupled to the second and third complementary output voltage nodes, respectively, and a gate coupled to the first supply voltage node.

6. The voltage level shifter of claim 5, wherein the first level shifting stage includes:

a third and a fourth transistors that are cross-coupled, the third transistor having a first conduction terminal coupled to the gate of the third output transistor, a second conduction terminal coupled to the first supply voltage node, and a gate coupled to the third complementary output voltage node, the second transistor having a first conduction terminal coupled to the gate of the third output transistor, a second conduction terminal coupled to the third complementary output voltage node, and a gate coupled to the first supply voltage node.

7. The voltage level shifter of claim 1, wherein the first level shifting stage includes:

a fifth transistor having a first conduction terminal coupled to the second complementary output voltage node, a second conduction terminal coupled to the first supply voltage node and a gate coupled to the gate of the first complementary output transistor; and a sixth transistor having a first conduction terminal coupled to the third output voltage node, a second conduction terminal coupled to the first supply voltage node and a gate coupled to the gate of the third output transistor.

8. The voltage level shifter of claim 1, comprising:

a second level shifting stage coupled to the third output voltage node, the second complementary output voltage node, fourth and fifth output voltage nodes and fourth and fifth complementary output voltage nodes, the second level shifting stage being configured to:

receive a second supply voltage and a third supply voltage; and output one of a first supply voltage, the second supply voltage and the third supply voltage over the fourth and fifth output voltage nodes and the fourth and fifth complementary output voltage nodes based on voltages of the third output voltage node and the second complementary output voltage node.

9. The voltage level shifter of claim 8, wherein the second level shifting stage has an identical structure as the first level shifting stage.

10. The voltage level shifter of claim 1, wherein the input stage is configured to:

receive an input voltage over the input voltage node and a complementary input voltage over the complementary input voltage node;

receive a first supply voltage and a ground voltage;

output one of the first supply voltage and the ground voltage over the first output voltage node based on the input voltage and the complementary input voltage; and output one of the first supply voltage and the ground voltage over the first complementary output voltage node based on the input voltage and the complementary input voltage.

11. The voltage level shifter of claim 10, wherein the input stage is configured to output the ground voltage over the first output voltage node and the first supply voltage over the first complementary output voltage node when the input voltage is the ground voltage and the complementary input voltage node is an on voltage, and the input stage is configured to output the first supply voltage over the first output voltage node and the ground voltage over the first complementary output voltage node when the input voltage is the on voltage and the complementary input voltage node is the ground voltage.

12. The voltage level shifter of claim 10, wherein the first level shifting stage is configured to output a ground voltage over the second output voltage node, and a second supply voltage over the second complementary output voltage node when the input voltage is the ground voltage and the complementary input voltage node is an on voltage, and the first level shifting stage is configured to output the second supply voltage over the second output voltage node, and the first supply voltage over the second complementary output voltage node when the input voltage is the on voltage and the complementary input voltage node is the ground voltage.

13. The voltage level shifter of claim 8, wherein the second level shifting stage is configured to output the first supply voltage over the fourth output voltage node, the second supply voltage over the fifth output voltage node, and the third supply voltage over both the fourth and fifth complementary output voltage nodes when an input voltage of the input voltage node is the ground voltage and an input voltage of the complementary input voltage node is an on voltage, and the second level shifting stage is configured to output the third supply voltage over both the fourth and fifth output voltage nodes, the first supply voltage over the fourth complementary output voltage node, and the second supply voltage over the fifth complementary output voltage node when the input voltage of the input voltage node is the on voltage and the input voltage of the complementary input voltage node is the ground voltage.

14. A method, comprising:

receiving, by an input stage, an input voltage, a complementary input voltage, a ground voltage and a first supply voltage, the first supply voltage being received over a first supply voltage node;

outputting, based on the input voltage and the complementary input voltage, a first output voltage, over a first output voltage node, as one of the first supply voltage and the ground voltage and a first complementary output voltage, over a first complementary output voltage node, as another one of the first supply voltage and the ground voltage;

receiving, by a first level shifting stage, the first output voltage, the first complementary output voltage, the first supply voltage, and a second supply voltage the second supply voltage being received over a second supply voltage node; and outputting, by the first level shifting stage based on the first output voltage and the first complementary output voltage, a second output voltage over a second output voltage node, a second complementary output voltage over a second complementary output voltage node, a third output voltage over a third output voltage node, and a third complementary output voltage over a third complementary output voltage node from one of the ground voltage, the first supply voltage and the second supply voltage, the first level shifting stage including:

a first output transistor having first and second conduction terminals coupled to the first output voltage node and the second output voltage node, respectively, and a gate coupled to the first supply voltage node;

a first complementary output transistor having first and second conduction terminals coupled to the second complementary output voltage node and the second supply voltage node, respectively; and first and second transistors that are cross-coupled, the first transistor having a first conduction terminal coupled to a gate of the first complementary output transistor, a second conduction terminal coupled to the first supply voltage node, and a gate coupled to the second output voltage node, the second transistor having a first conduction terminal coupled to the gate of the first complementary output transistor, a second conduction terminal coupled to the second output voltage node, and a gate coupled to the first supply voltage node.

15. The method of claim 14, wherein outputting the first output voltage as one of the first supply voltage and the ground voltage and the first complementary output voltage as another one of the first supply voltage and the ground voltage includes outputting the first output voltage as the ground voltage and the first complementary output voltage as the first supply voltage on a condition that the input voltage is the ground voltage and the complementary input voltage is the first supply voltage.

16. The method of claim 15, wherein outputting the first output voltage as one of the first supply voltage and the ground voltage and the first complementary output voltage as another one of the first supply voltage and the ground voltage includes outputting the first output voltage as the first supply voltage and the first complementary output voltage as the ground voltage on a condition that the input voltage is the first supply voltage and the complementary input voltage is the ground voltage.

17. The method of claim 14, wherein outputting the second output voltage, the second complementary output voltage, the third output voltage, and the third complementary output voltage includes outputting the second output voltage as the ground voltage, the third output voltage as the first supply voltage, the second complementary output voltage as the second supply voltage and the third complementary output voltage as the second supply voltage on a condition that the first output voltage is the ground voltage and the first complementary output voltage is the first supply voltage.

18. The method of claim 14, wherein outputting the second output voltage, the second complementary output voltage, the third output voltage, and the third complementary output voltage includes outputting the second output voltage as the second supply voltage, the third output voltage as the second supply voltage, the second complementary output voltage as the second supply voltage and the third complementary output voltage as the second supply voltage on a condition that the first output voltage is the first supply voltage and the first complementary output voltage is the ground voltage.

19. The method of claim 14, comprising:
receiving, by a second level shifting stage, the third output voltage, the second complementary output voltage, and a third supply voltage; and outputting, by the second level shifting stage based on the third output voltage and the second complementary output voltage, a fourth output voltage, a fourth complementary output voltage, a fifth output voltage, and a fifth complementary output voltage from one of the first supply voltage, the second supply voltage and the third supply voltage.

20. A voltage level shifter, comprising:
an input stage coupled between a first supply voltage node and a ground terminal and having an input voltage node, a complementary input voltage node, a first output voltage node and a first complementary output voltage node, the input stage being configured to provide the first supply voltage at the first complementary output voltage node and the ground voltage at the first output voltage node in response to receiving an input voltage at the input voltage; and
a level shifting stage including:
a first transistor having a conduction path coupled between the first output voltage node and a second output voltage node, and a control terminal coupled to the first voltage supply node;
a second transistor having a conduction path coupled between a second complementary output voltage node and a second supply voltage node; and
first and second cross-coupled transistors, the first cross-coupled transistor having a conduction path coupled between the control terminal of the second transistor and the first supply voltage node and a control terminal coupled to the second output voltage node, and the second cross-coupled transistor having a conduction path coupled between the control terminal of the second transistor and the second output voltage node and a control terminal coupled to the first supply voltage node.

21. The voltage level shifter of claim 20, wherein the level shifting stage includes:
a third transistor having a conduction path coupled between the first complementary output voltage node and a second complementary output voltage node, and a control terminal coupled to the first voltage supply node;
a fourth transistor having a conduction path coupled between a third output voltage node and the second supply voltage node; and
third and fourth cross-coupled transistors, the third cross-coupled transistor having a conduction path coupled between the control terminal of the fourth transistor and the first supply voltage node and a control terminal coupled to the second complementary output voltage node, and the fourth cross-coupled transistor having a conduction path coupled between the control terminal of the fourth transistor and the second complementary output voltage node and a control terminal coupled to the first supply voltage node.

* * * * *